United States Patent [19]
Main et al.

[11] Patent Number: 5,497,123
[45] Date of Patent: Mar. 5, 1996

[54] AMPLIFIER CIRCUIT HAVING HIGH LINEARITY FOR CANCELLING THIRD ORDER HARMONIC DISTORTION

[75] Inventors: W. Eric Main, Mesa; Jeffrey C. Durec, Chandler, both of Ariz.

[73] Assignee: Motorola, Inc., Schaumburg, Ill.

[21] Appl. No.: 363,089

[22] Filed: Dec. 23, 1994

[51] Int. Cl.$^6$ ........................................................ H03F 3/45
[52] U.S. Cl. ............................ 330/257; 330/288; 330/301
[58] Field of Search ........................................ 330/257, 275, 330/288, 301; 327/113; 455/317, 333

[56] References Cited

U.S. PATENT DOCUMENTS

| | | |
|---|---|---|
| 4,723,110 | 2/1988 | Voorman . |
| 5,043,674 | 8/1991 | Bonaccio et al. ..................... 330/257 |
| 5,107,134 | 4/1992 | Itoh .................................. 330/288 X |

FOREIGN PATENT DOCUMENTS

| | | | |
|---|---|---|---|
| 109081 | 5/1984 | European Pat. Off. ............. | 330/257 |

OTHER PUBLICATIONS

Kimura, "A Bipolar Four-Quadrant Analog Quarter-Square Multiplier Consisting of Unbalanced Emitter-Coupled Pairs and Expansions of Its Input Ranges", IEEE Journal of Solid-State Circuits., vol. 29, No. 1, Jan. 1994.

Kimura, "Some Circuit Design Techniques Using Two Cross-Coupled, Emitter-Coupled Pairs", IEEE Transactions On Circuits and Systems 1: Fundamental Theory and Applications, vol. 41, No. 5, May 1994 pp. 411–423.

Primary Examiner—James B. Mullins
Attorney, Agent, or Firm—Gary W. Hoshizaki

[57] ABSTRACT

A amplifier (21) having increased linearity, low input impedance, and low noise is provided. The amplifier (21) has an input (22), a bias input, a first output (23), and a second output (33). A first transistor (26) has a collector coupled to the first output (23), a base coupled to the bias input, and an emitter. A first resistor (27) is coupled between the emitter of the first transistor (26) and the input (22). A second transistor (29) has a collector and base coupled in common, and an emitter coupled for receiving a power supply voltage. A second resistor (28) couples between the input (22) and the common base and collector of the second transistor (29). A third transistor (32) has a collector coupled to the second output (33), a base coupled to the common base and collector of the second transistor (29), and an emitter coupled for receiving the power supply voltage. An input signal applied to the input (22) generates a differential current at the first and second outputs (23, 33). The input signal and the differential current have a linear relationship.

16 Claims, 3 Drawing Sheets

AMPLIFIER CIRCUIT HAVING HIGH LINEARITY FOR CANCELLING THIRD ORDER HARMONIC DISTORTION

BACKGROUND OF THE INVENTION

This invention relates, in general, to amplifiers, and more particularly, to an amplifier having a linear transfer function.

An amplifier is a circuit that receives an input signal and provides an amplified output signal. The input signal to output signal transfer function is often a critical parameter when choosing an amplifier for a specific application. In particular, an amplifier may be required to have a linear input signal to output signal transfer function. Non-linearities in the transfer function of a linear amplifier will produce distortion components of the input signal.

An example of a circuit using an amplifier having a linear transfer function is a mixer circuit for mixing a high frequency carrier signal with a local oscillator signal. The mixer circuit typically reduces the frequency of the high frequency carrier signal. Characteristics used to measure the performance of a mixer circuit are gain, noise, quiescent current, peak available current, linearity, and distortion. Linearity is of special importance because it determines the accuracy in which the lower frequency is generated. Any non-linearities in the mixer circuit may also generate intermodulation frequencies that affect circuit performance.

A common circuit used as a linear amplifier is a differential input stage (a differential pair of transistors) biased by a current source. Degeneration resistors are used to linearize the response of a differential input stage when non-linear element such as bipolar transistors are used in the differential input stage. A degeneration resistor dominates the non-linear characteristics of a bipolar transistor producing a linear response. The linearity can be increased by increasing the degeneration resistor but comes at the expense of reducing transconductance and increasing noise. In general, an enhancement of specific performance characteristics usually results in a degradation of other operating parameters.

It would be of great benefit if an amplifier could be provided that provides a linear transfer function without compromising other performance factors.

DETAILED DESCRIPTION

An amplifier is an element common to many analog circuits. For example, amplifiers are used in analog mixers, filters, multipliers, and oscillators. An input signal is applied to an amplifier and amplified by the amplifier. The relationship between an input signal applied to an amplifier and an output signal provided by the amplifier is known as a transfer function. In general, an amplifier having a transfer function that is linear or has a linear relationship between the input and output signals is useful for many different circuit applications. The transfer function is not the only parameter of importance in the design of an amplifier, other parameters that affect the performance of an amplifier are transconductance, dynamic range, frequency range, noise, and power dissipation.

Figure 1:
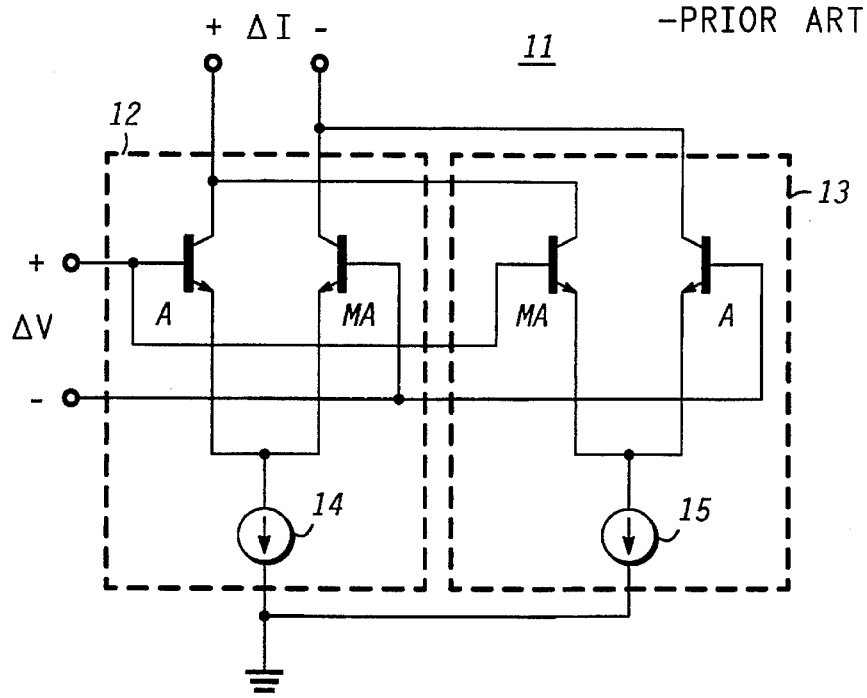
FIG. 1 is a schematic diagram of a prior art circuit of an amplifier comprising a pair of unbalanced differential input stages.

FIG. 1 is a prior art schematic diagram of an amplifier 11. Amplifier 11 is a transconductance amplifier and is widely used in circuits requiring a wide input voltage range and high linearity. Furthermore, amplifier 11 is commonly used in mixer circuits operating at high frequencies. Amplifier 11 comprises a differential input stage 12 and a differential input stage 13. Current sources 14 and 15 respectively bias differential input stages 12 and 13.

Amplifier 11 utilizes two offset transfer functions that, when summed, increase the dynamic range. The offset transfer functions are created by differential input stages 12 and 13 being unbalanced. An unbalanced differential input stage comprises transistors having different emitter areas. In FIG. 1, the transistors which comprise either differential input stage 12 or 13 differ in size by an emitter area ratio of M. The linear range of amplifier 11 is determined by the emitter area ratio of the transistors which comprise differential input stages 12 and 13 and the current magnitude of current sources 14 and 15. The response of amplifier 11 becomes non-linear as the current provided by current sources 14 or 15 predominantly goes through one of the transistors which comprise either differential input stage 12 or 13.

Although only a single variant of amplifier 11 is shown, there are many different embodiments of amplifier 11 which are commonly used. Moreover, the different embodiments operate under the same basic principles having unbalanced differential input stages that are biased with a current source. The use of degeneration resistors in amplifier 11 is a typical modification for enhancing its linearity. Variants of amplifier 11 are disclosed in U.S. Pat. No. 4,723,110 by J. Voorman, I.E.E.E. Transactions On Circuits and Systems—1: Fundamental Theory and Applications, Volume 41, No. 5, May 1994, "Some Circuit Design Techniques Using Two Cross-Coupled, Emitter-Coupled Pairs", by Katsuji Kimura, and the I.E.E.E. Journal of Solid-State Circuits, Volume 29, No. 1, January 1994, "A Bipolar Four-Quadrant Analog Quarter-Square Multiplier Consisting of Unbalanced Emitter-Coupled Pairs and Expansions of Its Input Ranges" by Katsuji Kimura which are hereby incorporated by reference. Amplifier 11 provides increased dynamic range but compromises other operating characteristics, such as transconductance and noise figure. Individual operating characteristics of an amplifier are interrelated, these operating characteristics (linearity, dynamic range, noise figure, power dissipation, transconductance, etc.) are typically balanced in the amplifier design so no one particular characteristic is significantly degraded.

A characteristic that is inherent to the design of amplifier 11 is a high non-linear input impedance. A low input impedance is sometimes required to match an impedance of a voltage source providing an input signal. A low input impedance is provided by coupling a resistor across the inputs of amplifier 11. The resistor is a passive device that shunts part of the input power and is a noise source that increases the noise figure of amplifier 11.

Figure 2:
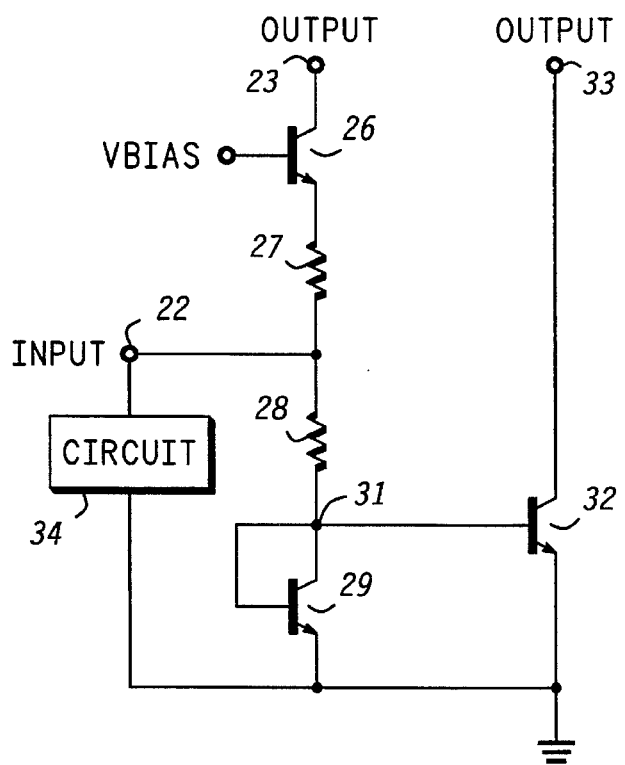
FIG. 2 is a schematic diagram of an amplifier in accordance with the present invention.

FIG. 2 is a schematic diagram of an amplifier 21 having a single-ended input and differential output. Amplifier 21 can also be operated using a single output but will have increased distortion. Amplifier 21 has an input 22 for receiving an input signal, and outputs 23 and 33 for providing a differential output signal. A circuit 34 provides an input signal to input 22 of amplifier 21. Amplifier 21 comprises transistors 26, 29, and 32, and resistors 27 and 28. Amplifier 21 has an input impedance that is tailored to match a source impedance, wide dynamic range, low noise, high peak current, low quiescent current, high transconductance, and high linearity.

Transistors 26, 29, and 32 are bipolar transistors having a collector, base, and emitter respectively corresponding to a first electrode, control electrode, and a second electrode. Transistor 29 is in a diode configuration having a collector and base coupled in common to a node 31, and an emitter coupled for receiving a power supply voltage (e.g. ground). Resistor 28 has a first terminal coupled to node 31 and a second terminal coupled to input 22. Resistor 27 has a first terminal coupled to input 22 and a second terminal. Transistor 26 has a collector coupled to output 23, a base coupled for receiving a bias voltage VBIAS, and an emitter coupled to the second terminal of resistor 27. Transistor 32 mirrors the current of transistor 29. Transistor 32 has a collector coupled to output 33, a base coupled to node 31, and an emitter coupled for receiving the power supply voltage (e.g. ground).

In the preferred embodiment, an input signal from circuit 34 is AC coupled to input 22. Transistors 26, 29, and 32 have identical geometries. Similarly, resistors 27 and 28 have equal resistance. The input impedance of amplifier 21 is matched to a source impedance of circuit 34. Matching the input impedance of amplifier 21 to the source impedance of circuit 34 maximizes power transfer and increases operating efficiency. Prior art amplifier 11 of FIG. 1 inherently has a high input impedance. A value of input impedance for matching a source impedance is typically 50 or 75 ohms which is significantly less than the input impedance of amplifier 11 (FIG. 1). A resistor having a value of 50 or 75 ohms is used to lower the input impedance of amplifier 11. The resistor is coupled to the inputs of amplifier 11 to the detriment of other operating characteristics (noise and transconductance). The configuration of amplifier 21 does not require an additional resistor at its input to lower the input impedance. Eliminating the resistor increases the transconductance of amplifier 21 and reduces noise. The input impedance of amplifier 21 is shown in equation 1.

$$Zin=(R+r_e)/2 \qquad (1)$$

R is the value of resistor 27 (or resistor 28) and $r_e$ is $V_t/I_c$ (impedance of transistors 26 and 29). $V_t$ is the thermal voltage of transistor 26 or 29. $I_c$ is the collector current of transistor 26 and 29. Under quiescent conditions (no input signal) the current and thermal voltages of transistors 26 and 29 are approximately equal. As mentioned previously, Zin is chosen to match the source impedance of circuit 34 coupled to input 22 (for example 50 or 75 ohms).

Resistors 27 and 28 linearize the input to output transfer function of amplifier 21. Non-linear distortion occurs due to transistors 26 and 29. In a single-ended application where only a single output, for example, output 23 is active, both even and odd harmonic distortion is generated due to the non-linear characteristics of transistors 26 and 29. Even harmonic distortion is eliminated by adding mirror transistor 32 and generating a differential output signal at outputs 23 and 33. The remaining odd harmonic distortion is greatest at the third harmonic and decreases in magnitude with each increasing harmonic (fifth, seventh, etc.).

The third harmonic distortion generated at outputs 23 and 33 is canceled by choosing a specific value for resistors 27 and 28. The specific value for R (resistors 27 and 28) is defined in equation 2.

$$R=r_e/2 \qquad (2)$$

The input impedance (Zin) of amplifier 21 for matching a source impedance of circuit 34 and nulling the third harmonic distortion is shown in equation 3.

$$Zin=3/4*r_e \qquad (3)$$

Zin is selected to match (or approximate) the source impedance of circuit 34 to maximize signal transfer to amplifier 21. Transistors 29 and 26 are biased to generate a value for $r_e$ based on equation 3. The bias current is adjusted by a bias voltage VBIAS applied to the base of transistor 26 for setting the quiescent collector current ($I_c$) of transistors 26, 29, and 32. The collector current ($I_c$) is defined in equation 4.

$$I_c=(VBIAS-2*Vbe)/(2*R) \qquad (4)$$

Vbe is a base-emitter voltage of transistors 26 and 29. Resistors 27 and 28 are identical (R) and transistors 26, 29, and 32 are identical in size (or as closely matched as possible).

The circuit configuration of amplifier 21 allows the third harmonic distortion to be nulled. Reducing distortion produced by amplifier 21 improves linearity. Noise is reduced and transconductance increased when compared to the circuit configuration of amplifier 11 of FIG. 1 due to the elimination of a resistor required by amplifier 11 to lower its input impedance to match a source impedance.

Amplifier 21 is described as a push-pull amplifier. Transistor 26 is biased as a common-base stage. An input signal applied to input 22 changes a voltage across the base-emitter junction of transistor 26 and resistor 27, and a voltage across the base-emitter junction of transistor 29 and resistor 28. In the preferred embodiment, the input signal from circuit 34 is AC coupled to input 22 of amplifier 21.

If a single-ended output is used, for example output 23, an input signal applied to input 22 will increase or decrease the current provided by transistor 26. The voltage swing is limited for a positive voltage transition at input 22 when transistor 26 turn off. A negative voltage swing at input is only limited by the maximum current capability of transistor 26.

In the preferred embodiment, a differential output signal is generated at outputs 23 and 33. An input signal having a positive voltage transition applied to input 22 reduces a voltage across the base-emitter junction of transistor 26 and resistor 27. Conversely, a voltage across the base-emitter junction of transistor 29 and resistor 28 is increased. Transistor 32 is a mirror transistor of a current mirror circuit formed by transistors 29 and 32. The increase in base-emitter voltage of transistor 29 is mirrored to transistor 32 which increases a current provided at output 33.

An input signal having a negative voltage transition applied to input 22 has an opposite effect. A voltage across the base-emitter voltage of transistor 26 and resistor 27 is increased by the negative voltage transition. Conversely, a voltage across the base-emitter junction of transistor 29 and resistor 28 is decreased. The input signal having a negative voltage transition results in an increase in current at output 23 and a decrease in current at output 33.

Amplifier 21 remains linear over a wide input voltage range. The bias current of amplifier 21 does not limit the dynamic range as it does for amplifier 11 of FIG. 1. Amplifier 11 of FIG. 1 has an input voltage range that is limited by the current provided by current source 14 or 15. Increasing the current of current sources 14 and 15 will increase the dynamic range but will also increase power dissipation. Furthermore, the linearity of transconductance amplifier stage 11 is affected as the current goes predominantly through one of the transistors which comprise either differential input stage 12 or 13 (FIG. 1). Referring back to FIG. 2, the configuration of amplifier 21 is not limited by a current source that biases the stage. Amplifier 21 continues to perform linearly under extreme conditions when either transistor 26 or transistor 29 is turned off due to a large input signal. For example, an input signal having a large positive voltage transition applied to input 22 turns off transistor 26 but linearly increases the current through resistor 28 and transistor 29 which is mirrored by transistor 32 to output 33. Similarly, an input signal having a large negative voltage transition applied to input 22 turns transistors 29 and 32 off but linearly increases the current through resistor 27 and transistor 26 which is provided at output 23. Thus, the amplifier remains linear even under large input voltage swings.

The configuration of amplifier 21 provides several benefits when compared against other amplifiers. First, it provides a fairly constant input impedance over a wide input voltage range. Second, the input impedance is matched to the source impedance providing the input signal for maximum signal transfer. Third, amplifier 21 has a single-ended input which is often advantageous over a differential input. Fourth, in a differential output configuration, amplifier 21 is free of even harmonic distortions and nulls out a third harmonic distortion which increases the linearity. Fifth, it has linear characteristics over an extremely wide input voltage range. Sixth, the transconductance changes minimally over a wide input voltage range. Finally, amplifier 21 has increased transconductance and reduced noise due to the elimination of an input impedance matching resistor commonly used in other amplifier configurations.

Figure 3:
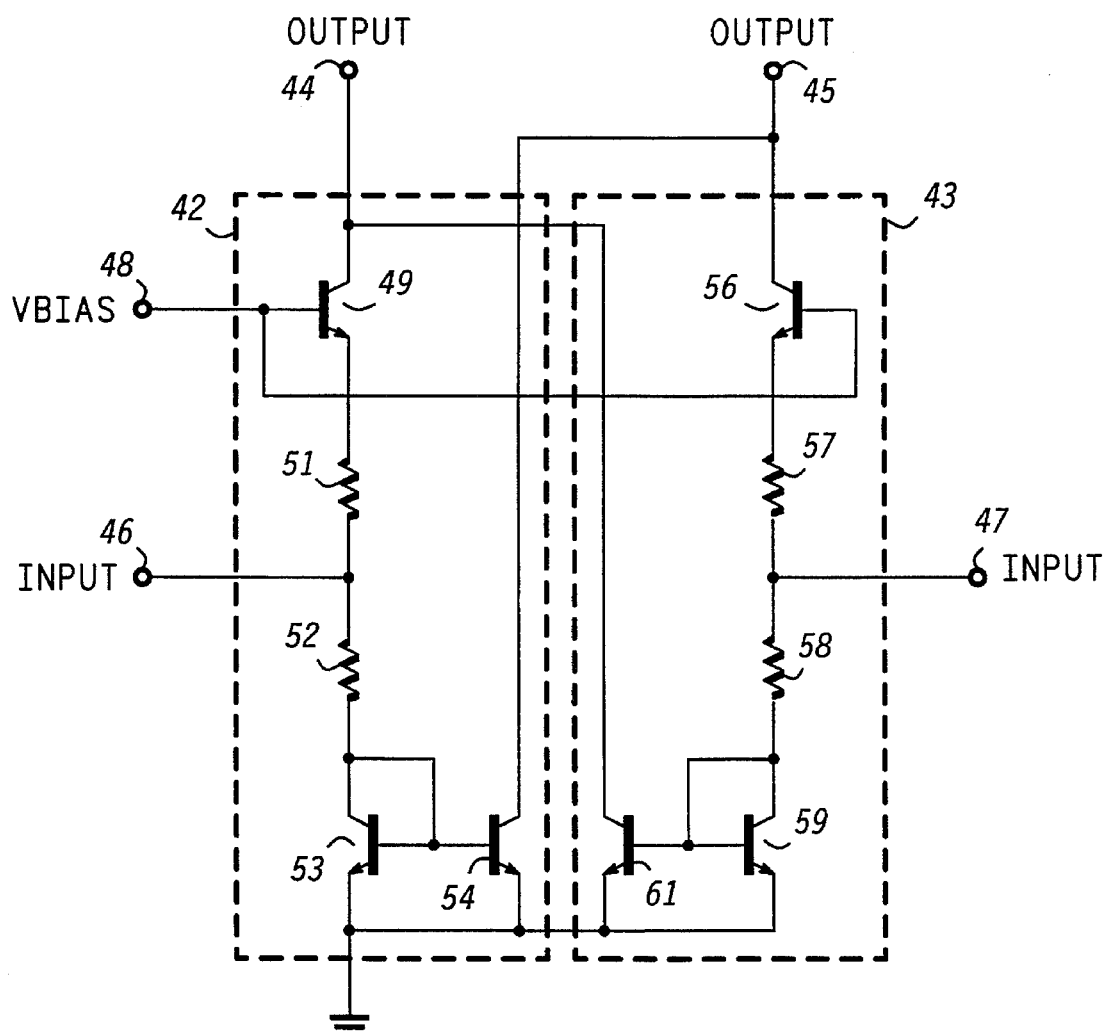
FIG. 3 is a schematic diagram of a full differential amplifier comprising a pair of the amplifiers of FIG. 2.

FIG. 3 is a schematic diagram of an amplifier 41 having a differential input and a differential output. Amplifier 41 comprises amplifiers 42 and 43 which are similar to amplifier 21 of FIG. 2. Amplifier 41 includes an input 46, an input 47, a bias input 48, an output 44, and an output 45.

In the preferred embodiment, transistors 49, 53, 54, 56, 59, and 61 are bipolar transistors having a collector, base, and emitter respectively corresponding to a first electrode, a control electrode, and a second electrode. Amplifier 42 comprises transistors 49, 53, and 54, and resistors 51 and 52. Transistor 49 has a collector coupled to output 44, a base coupled to bias input 48 for receiving a bias voltage VBIAS, and an emitter. Resistor 51 has a first terminal coupled to the emitter of transistor 49 and a second terminal coupled to input 46. Resistor 52 has a first terminal coupled to input 46 and a second terminal. Transistor 53 has a collector and base coupled in common to the second terminal of resistor 52, and an emitter coupled for receiving a power supply voltage (e.g. ground). Transistor 54 has a collector coupled to output 45, a base coupled to the base of transistor 53, and an emitter coupled for receiving the power supply voltage.

Transconductance amplifier 43 comprises transistors 56, 59, and 61, and resistors 57 and 58. Transistor 56 has a collector coupled to output 45, a base coupled to bias input 48 for receiving the bias voltage VBIAS, and an emitter. Resistor 57 has a first terminal coupled to the emitter of transistor 56 and a second terminal coupled to input 47. Resistor 58 has a first terminal coupled to input 47 and a second terminal. Transistor 59 has a collector and base coupled in common to the second terminal of resistor 58, and an emitter coupled for receiving a power supply voltage (e.g. ground). Transistor 61 has a collector coupled to output 44, a base coupled to the base of transistor 59, and an emitter coupled for receiving the power supply voltage.

Amplifier 41 is full differential in its design. In the preferred embodiment, transistors 49, 53, 54, 56, 59, and 61 are identical in size. Similarly, resistors 51, 52, 57, and 58 have the same resistance. A resistor value $R=r_e/2$, (R=resistors 51, 52, 57, and 58, $r_e$= impedance of transistors 49, 53, 56, and 59) nulls out a third harmonic distortion produced by amplifier 41. Also, the input impedance of amplifier 41 is matched to a source impedance of a circuit (not shown) coupled to inputs 46 and 47 for providing an input signal. The impedance of transistors 49, 53, 56, and 59 is adjusted by changing the bias voltage VBIAS applied to bias input 48.

In the preferred embodiment, a differential voltage is AC coupled to inputs 46 and 47. Under quiescent conditions the voltage at inputs 46 and 47 are the same. An input signal having a positive voltage transition across inputs 46 and 47 (a voltage at input 46 is greater than the voltage at input 47) decreases a current of transistor 49 and 59, and increases a current of transistors 53 and 56. The current of transistors 49 and 61 (it mirrors transistor 59) decrease thereby reducing the current at output 44. The current of transistors 54 (it mirrors transistor 53) and 56 increase thereby increasing the current at output 45.

A differential input signal having a negative voltage transition across inputs 46 and 47 (a voltage at input 46 is less than the voltage at input 47) increases a current of transistor 49 and 59, and decreases a current of transistors 53 and 56. The current of transistors 49 and 61 (it mirrors transistor 59) increase thereby increasing the current at output 44. The current of transistors 54 (it mirrors transistor 53) and 56 decrease thereby reducing the current at output 45. Amplifier 41 is a full differential amplifier embodying the basic principles described hereinabove in the detailed description of FIG. 2.

Figure 4:
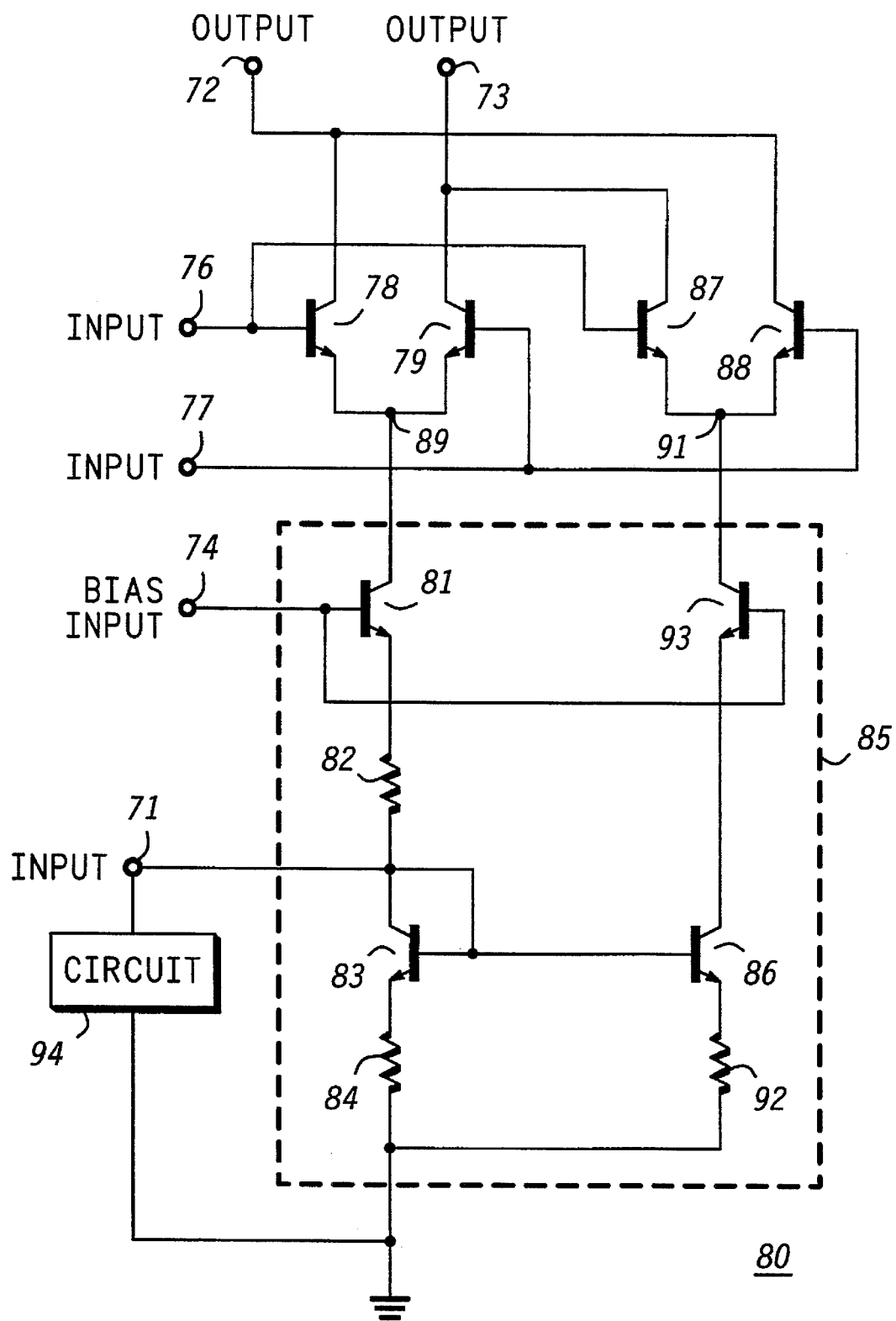
FIG. 4 is a schematic diagram of an amplifier for mixing a first signal with a second signal in accordance with the present invention.

FIG. 4 is a schematic diagram of an amplifier 80 for mixing signals. Amplifier 80 includes an amplifier 85 that is an alternate embodiment of amplifier 21 of FIG. 2. In general, amplifier 80 mixes a first signal with a second signal to reduce a frequency of the first signal. The first signal typically has modulated information that is not affected by the mixing process. Amplifier 80 has an input 71 for receiving the first signal, outputs 72 and 73 for providing an output signal, inputs 76 and 77 for receiving the second signal, and a bias input 74 for receiving a bias voltage.

Amplifier 80 comprises transistors 78, 79, 81, 83, 86, 87, 88, and 93, and resistors 82, 84, and 92. Transistors 78, 79, 81, 83, 86, 87, 88, and 93 each have a collector, base, and emitter respectively corresponding to a first electrode, control electrode, and a second electrode. Transistors 78 and 79 form a differential input stage. Transistor 78 has a collector coupled to output 72, a base coupled to input 76, and an emitter coupled to a node 89. Transistor 79 has a collector coupled to output 73, a base coupled to input 77, and an emitter coupled to node 89. Transistors 87 and 88 form a second differential input stage. Transistor 87 has a collector coupled to output 73, a base coupled to input 76, and an emitter coupled to a node 91. Transistor 88 has a collector coupled to output 72, a base coupled to input 77, and an emitter coupled to node 91.

Amplifier 85 comprises transistors 81, 83, 86, and 93, and resistors 82 and 83. Transistor 81 has a collector coupled to node 89, a base coupled to bias input 74, and an emitter. Resistor 82 has a first terminal coupled to the emitter of transistor 81 and a second terminal coupled to input 71. Transistor 83 has a first electrode and control electrode coupled in common to input 71, and an emitter. Resistor 84 has a first terminal coupled to the emitter of transistor 83 and a second terminal coupled for receiving a power supply voltage (e.g. ground). Transistor 93 has a collector coupled to node 91, a base coupled to bias input 74, and an emitter. Transistor 86 has a collector coupled to the emitter of transistor 93, a base coupled to the base of transistor 83, and an emitter. A resistor 92 has a first terminal coupled to the emitter of transistor 86 and a second terminal coupled for receiving the power supply voltage.

Amplifier 85 operates similar to transconductance amplifier 21 of FIG. 2. In the preferred embodiment, transistors 81, 83, 86, and 91 have are matched having the same size. Resistors 82, 83, and 92 are matched to have the same resistance value. Transistor 81 is a common base amplifier. Resistors 82 and 84 are degeneration resistors for linearizing an input signal to output signal transfer function of amplifier 85. Transistor 83 is in a diode configuration and generates a complementary signal to a signal provided at the collector of transistor 81. Transistor 83 and 86 form a current mirror. Transistor 86 and resistor 92 respectively matches transistor 83 and resistor 94 for providing an equivalent current. Resistor 92 provides an added benefit of increasing an output impedance (at the collector) of transistor 86. Transistor 93 is a cascode transistor for reducing a voltage across transistor 86.

Amplifier 85 has an input impedance matched to a source impedance of a circuit 94 that provides an input signal coupled to input 71. Even harmonic distortion is canceled by the differential signal provided at nodes 89 and 91 by amplifier 85. A third harmonic distortion of amplifier 85 is nulled by selecting $R=r_e/2$ where R= resistors 82, 84, and 93, and $r_e$ is the impedance of transistors 81 and 83 (at the emitter). The input impedance is matched by selecting $Zin=3/4 * r_e$. The impedance of transistors 81 and 83 are adjusted by a bias voltage applied to bias input 74. The bias voltage adjust the current through transistors 81 and 83 thereby determining the value of $r_e$. The input signal applied to input 71 produces a linear change at the collectors of transistors 81 and 93.

A differential input signal is applied to inputs 76 and 77. Inputs 76 and 77 couple to differential input stages comprising transistors 78 and 79, and transistors 87 and 88. The current from transistors 81 and 85 respectively biases transistors 78 and 79, and transistors 87 and 88. The change in bias current due to the input signal applied to input 71 is mixed with the differential input signal producing a signal of reduced frequency at outputs 72 and 73 as is well known by one skilled in the art. In general, a high frequency carrier signal is applied to either input 71 or inputs 76 and 77. The high frequency carrier includes modulated information. A local oscillator signal is mixed with the high frequency carrier and is applied to a remaining input. A difference frequency is generated at outputs 72 and 73 that is lower than the high frequency carrier. The modulated information on the high frequency carrier is unaffected by the mixing and remains on the difference frequency. Amplifier 85 of amplifier 80 produces an output signal with less distortion and noise when compared with other amplifier designs for mixing signals thereby generating a difference frequency with less distortion and noise.

By now it should be appreciated that a transconductance amplifier has been provided that has a low input impedance, low distortion, high linearity, high transconductance, and low noise.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:
1. An amplifier comprising:
   a first transistor having a first electrode, a control electrode coupled for receiving a bias voltage, and a second electrode;
   a first resistor having a first terminal coupled to said second electrode of said first transistor and a second terminal;
   a second resistor having a first terminal coupled to said second terminal of said first resistor and a second terminal; and
   a second transistor having a first electrode and a control electrode coupled in common to said second terminal of said second resistor, and a second electrode coupled for receiving a power supply voltage, the amplifier having an input coupled to said second terminal of said first resistor for receiving an input signal and a first output coupled to said first electrode of said first transistor for providing an output signal wherein said first and second resistors have an impedance approximately one half an impedance of said first and second transistors for nulling out a third harmonic distortion.

2. The amplifier as recited in claim 1 further including a third transistor having a first electrode, a control electrode coupled to said control electrode of said second transistor, and a second electrode coupled for receiving said power supply voltage, the amplifier having a second output coupled to said first electrode of said third transistor, the amplifier providing a differential output signal at said first and second outputs.

3. The amplifier as recited in claim 2 wherein said first, second, and third transistors are identical in size.

4. The amplifier as recited in claim 3 wherein said first and second resistors have identical resistance.

5. The amplifier as recited in claim 4 wherein an input impedance of the amplifier is matched to a source impedance of a circuit for providing said input signal to said input of the amplifier.

6. An amplifier having a first differential input, a second differential input, an input for receiving a bias voltage, a first differential output, and a second differential output, the amplifier comprising:
   a first transistor having a first electrode coupled to the first differential output of the amplifier, a control electrode coupled to the input of the amplifier, and a second electrode;
   a first resistor having a first terminal coupled to said second electrode of said first transistor and a second terminal coupled to the first differential input of the amplifier;
   a second resistor having a first terminal coupled to the first differential input of the amplifier and a second terminal;
   a second transistor having a first electrode and a control electrode coupled in common to said second terminal of said second resistor, and a second electrode coupled for receiving a power supply voltage;
   a third transistor having a first electrode coupled to the second differential output of the amplifier, a control electrode coupled to said control electrode of said second transistor, and a second electrode coupled for receiving said power supply voltage;

a fourth transistor having a first electrode coupled to the second differential output of the amplifier, a control electrode coupled to the input of the amplifier, and a second electrode;

a third resistor having a first terminal coupled to said second electrode of said fourth transistor and a second terminal coupled to the second differential input of the amplifier;

a fourth resistor having a first terminal coupled to the second differential input of the amplifier and a second terminal;

a fifth transistor having a first electrode and a control electrode coupled in common to said second terminal of said fourth resistor, and a second electrode coupled for receiving said power supply voltage; and a sixth transistor having a first electrode coupled to the first differential output of the amplifier, a control electrode coupled to said control electrode of said fifth transistor, and a second electrode coupled for receiving said power supply voltage.

7. The amplifier as recited in claim 6 wherein said first, second, third, fourth, fifth, and sixth transistors are identical in size.

8. The amplifier as recited in claim 7 wherein said first, second, third, and fourth resistors have identical resistance.

9. An amplifier comprising:

a first transistor having a first electrode, a control electrode coupled for receiving a bias voltage, and a second electrode;

a first resistor having a first terminal coupled to said second electrode of said first transistor and a second terminal coupled to a first input of the amplifier;

a second transistor having a first electrode and a control electrode coupled in common to said first input of the amplifier, and a second electrode; and a second resistor having a first terminal coupled to said second electrode of said second transistor and a second terminal coupled for receiving a power supply voltage wherein said first transistor provides a signal at said first electrode that has a linear relationship to an input signal applied to said first input of the amplifier wherein said first and second resistors have an impedance approximately one half an impedance of said first and second transistors for nulling out a third harmonic distortion.

10. The amplifier as recited in claim 9 wherein said first and second transistors are identical in size.

11. The amplifier as recited in claim 10 wherein said first and second resistors are identical in resistance.

12. The amplifier in claim 9 further including:

a third transistor having a first electrode coupled to a first output of the amplifier, a control electrode coupled to a second input of the amplifier, and a second electrode coupled to said first electrode of said first transistor; and a fourth transistor having a first electrode coupled to a second output of the amplifier, a control electrode coupled to a third input of the amplifier, and a second electrode coupled to said first electrode of said first transistor.

13. The amplifier as recited in claim 12 further including:

a fifth transistor having a first electrode, a control electrode coupled for receiving said bias voltage, and a second electrode;

a sixth transistor having a first electrode coupled to said second electrode of said fifth transistor, a control electrode coupled to said control electrode of said second transistor, and a second electrode; and a third resistor having a first terminal coupled to said second electrode of said sixth transistor and a second terminal coupled for receiving said power supply voltage, said first electrode of said fifth transistor providing a complementary signal to said signal provided at said first electrode of said first transistor.

14. The amplifier as recited in claim 13 wherein said fifth and sixth transistors are identical in size to said first and second transistors, and wherein said third resistor has an identical resistance as said first and second resistors.

15. The amplifier as recited in claim 14 further including:

a seventh transistor having a first electrode coupled to said second output of the amplifier, a control electrode coupled to said second input of the amplifier, and a second electrode coupled to said first electrode of said fifth transistor; and a eighth transistor having a first electrode coupled to said first output of the amplifier, a control electrode coupled to said third input of the amplifier, and a second electrode coupled to said first electrode of said fifth transistor.

16. The amplifier as recited in claim 14 wherein an input impedance at the first input of the amplifier is matched to a source impedance of a circuit for providing said input signal to said first input of the amplifier.

* * * * *